United States Patent
Ma et al.

(10) Patent No.: US 8,947,945 B2
(45) Date of Patent: Feb. 3, 2015

(54) MEMORY CARD FOR STORING AND TRANSMITTING DATA

(71) Applicants: Hong Fu Jin Precision Industry (ShenZhen) Co., Ltd., Shenzhen (CN); Hon Hai Precision Industry Co., Ltd., New Taipei (TW)

(72) Inventors: Song Ma, Shenzhen (CN); Wei Pang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 36 days.

(21) Appl. No.: 13/920,059

(22) Filed: Jun. 17, 2013

(65) Prior Publication Data

US 2014/0169090 A1    Jun. 19, 2014

(30) Foreign Application Priority Data

Dec. 13, 2012   (CN) .......................... 2012 1 0537971

(51) Int. Cl.
*G11C 16/06* (2006.01)
*G11C 16/04* (2006.01)

(52) U.S. Cl.
CPC ...................................... *G11C 16/04* (2013.01)
USPC .................. 365/189.05; 365/185.05; 361/737

(58) Field of Classification Search
USPC .......................... 365/185.05, 189.05; 361/737
See application file for complete search history.

(56) References Cited

U.S. PATENT DOCUMENTS

| | | | | |
|---|---|---|---|---|
| 6,040,622 A | * | 3/2000 | Wallace | 257/679 |
| D444,473 S | * | 7/2001 | Okamoto et al. | D14/436 |
| 6,618,258 B2 | * | 9/2003 | Goris | 361/737 |
| 7,416,132 B2 | * | 8/2008 | Takiar et al. | 235/492 |

FOREIGN PATENT DOCUMENTS

KR    100843274 A  *  7/2008

OTHER PUBLICATIONS

SD Extend 300 Secure Digital Extender User's Manual, Oct. 2002, Sycard Technology, M200060-00.*

* cited by examiner

*Primary Examiner* — Harry W Byrne
*Assistant Examiner* — Lance Reidlinger
(74) *Attorney, Agent, or Firm* — Novak Druce Connolly Bove + Quigg LLP

(57) ABSTRACT

A memory card includes a control chip, a buffer, a NAND gate, and an inverter. The memory card has a first surface and a second surface opposite to the first surface. A first group of conductive pins is located on the first surface, and connected to the buffer through a first channel. A second group of conductive pins is located on the second surface, and connected to the buffer through a second channel. An order of pins of the first group of conductive pins located on the first surface from left to right is the same as an order of pins of the second group of conductive pins located on the second. The buffer is electrically connected to the control chip. Data can be transmitted between the first group of conductive pins or the second group of conductive pins and the control chip through the buffer.

6 Claims, 3 Drawing Sheets

MEMORY CARD FOR STORING AND TRANSMITTING DATA

BACKGROUND

1. Technical Field

The present disclosure relates to a memory card.

2. Description of Related Art

Secure digital (SD) memory cards have conductive pins to transmit data with electronic devices. The conductive pins are usually set on one surface of the SD memory card, which needs to be inserted in a specific direction in the electronic device. However, if the SD memory card is inserted in the electronic device in a wrong direction by mistake, the conductive pins not only cannot transmit data with the electronic device, but also may be damaged.

Therefore, there is need for improvement in the art.

BRIEF DESCRIPTION OF THE DRAWINGS

Many aspects of the present disclosure can be better understood with reference to the following drawing(s). The components in the drawing(s) are not necessarily drawn to scale, the emphasis instead being placed upon clearly illustrating the principles of the present disclosure. Moreover, in the drawing(s), like reference numerals designate corresponding parts throughout the several views.

DETAILED DESCRIPTION

Figure 1:
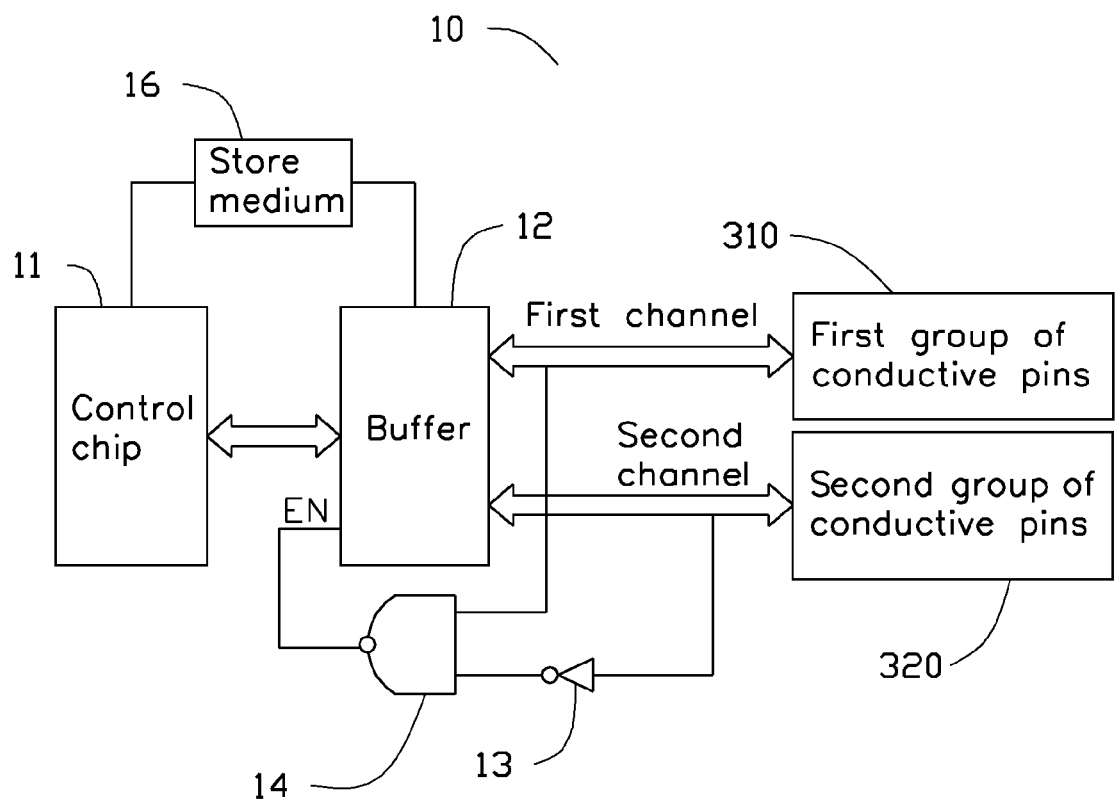
FIG. 1 is a block diagram of an embodiment of a memory card.

FIG. 1 is a block diagram of an embodiment of a memory card 10. The memory card 10 includes a control chip 11, a buffer 12 connected to the control chip 11, an inverter 13, and a NAND gate 14. Both of the inverter 13 and the NAND gate 14 are connected to the buffer 12. In the embodiment, the memory card 10 is a secure digital (SD) memory card. The control chip 11 can be a single chip or an embedded chip. The memory card 10 can be used in an electronic device, such as a notebook computer, a digital camera, or a digital video, for storing or transmitting data.

Figure 2:
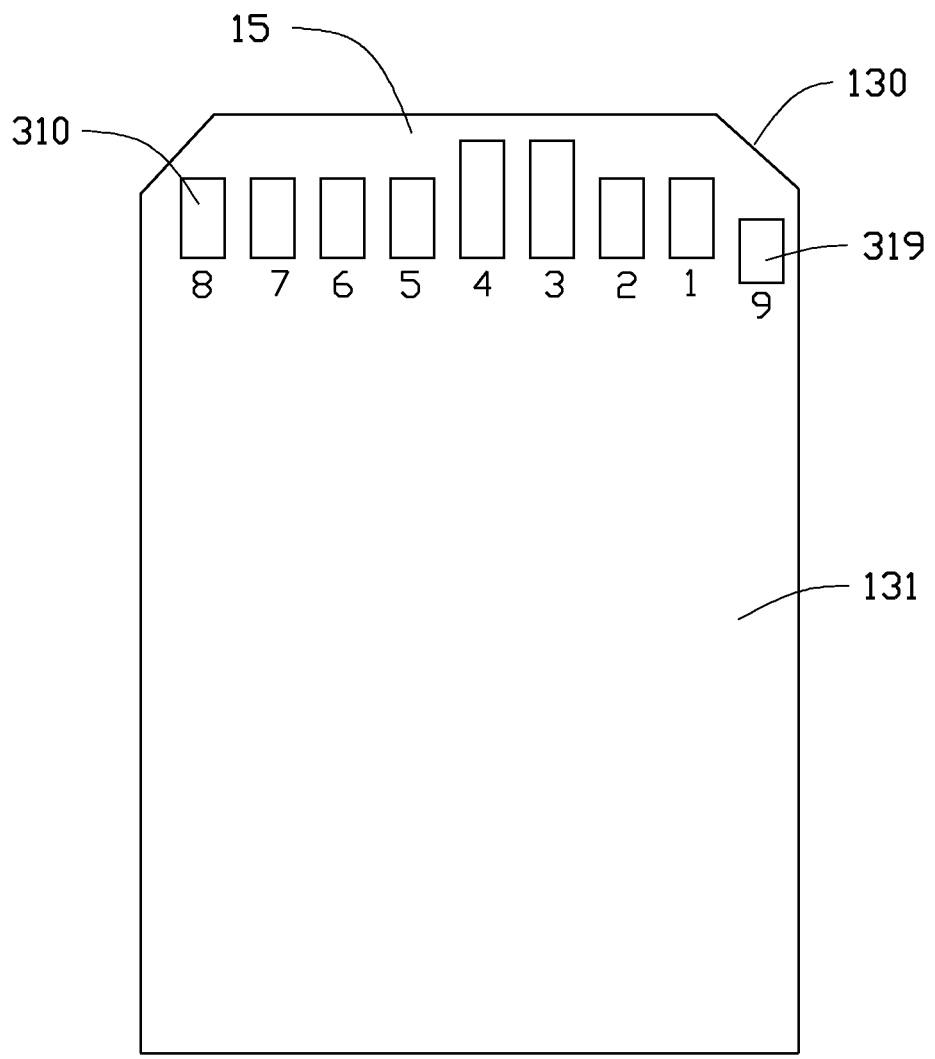
FIG. 2 is a schematic diagram of a first surface of the memory card of FIG. 1.
Figure 3:
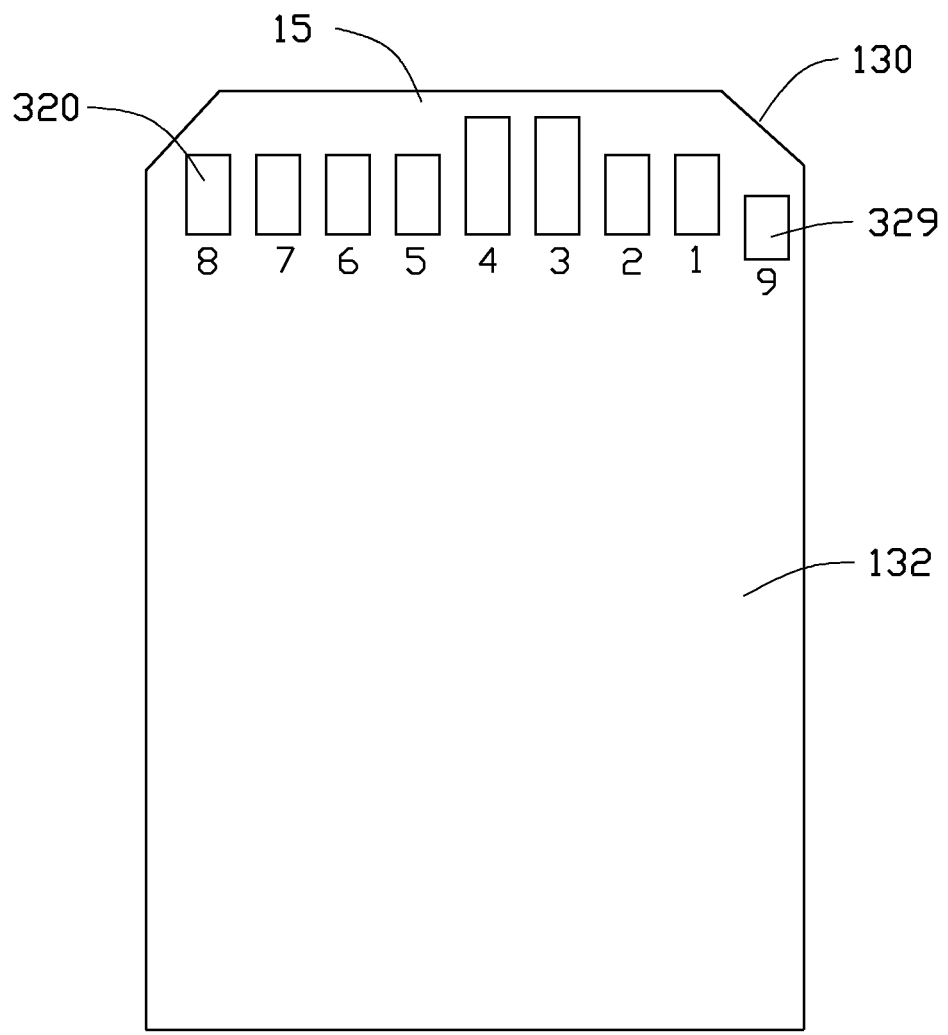
FIG. 3 is a schematic diagram of a second surface of the memory card of FIG. 1.

In FIGS. 2 and 3, the memory card 10 further includes a ridge spire 15 set on an end of the memory card 10, and two slanted sides 130 connected between opposite ends of the ridge spire 15 and opposite sides of the memory card 10.

The memory card 10 further includes a first surface 131 and a second surface 132 opposite to the first surface 131. A first group of conductive pins 310 are set on the first surface 131 adjacent to the ridge spire 15. A second group of conductive pins 320 are set on the second surface 132 adjacent to the ridge spire 15. Number of the first group of conductive pins 310 and the number of the second group of conductive pins 320 are both nine. Each group of the conductive pins comprises first to ninth pins 1-9. An order of the pins of the first group of conductive pins 310 located on the first surface 131 from left to right is same as an order of the pins of the second group of conductive pins 320 located on the second surface 132 from left to right. An order number of the pins of the first group of conductive pins 310 from left to right is "876543219", which respectively stand for DAT1 (data pin 1), DAT0 (data pin 0), Vss2 (ground pin 2), CLK (clock pin), Vdd (power pin), Vss1 (ground pin 1), CMD (command pin), CD/DAT3 (data pin 3), and DAT2 (data pin 2). The ninth pin 9 of the first group of conductive pins 310 is a first hot plug pin 319, which is used for accelerating data transmission when the memory card 10 is plugged or unplugged from the electronic device. The ninth pin 9 of the second group of conductive pins 320 is a second hot plug pin 329, which has the same function as the first hot plug pin 319.

Both of the first group of conductive pins 310 and the second group of conductive pins 320 are connected to the buffer 12. Both of the third pin 3 and the sixth pin 6 of each group of conductive pins function as ground pins. In the embodiment, the third pin 3 of the first group of conductive pins 310 is connected to a first input of the NAND gate 14. The third pin 3 of the second group of conductive pins 320 is connected to a second input of the NAND gate 14 through the inverter 13. An output of the NAND gate 14 is connected to an enable pin EN of the buffer 12. In another embodiment, the sixth pin 6 of the first group of conductive pins 310 and the sixth pin 6 of the second group of conductive pins 320 can replace the third pins 3 of the first and second groups of conductive pins 310 and 320 to be connected to the NAND gate 14. The NAND gate 14 is used for avoiding the third pins 3 of the first and second groups of conductive pins 310 and 320 to be connected to the enable pin EN of the buffer 12 at the same time, thus avoiding static damage.

In use, when the memory card 10 is inserted in a card reader of the electronic device, if the card reader contacts with the first group of conductive pins 310, the first group of conductive pins 310 operate. The third pin of the first group of conductive pins 310 transmits a low level signal, such as logic 0, to the first input of the NAND gate 14. The second input of the NAND gate 14 is connected to a signal of high impedance state with no logic level, due to the second group of conductive pins 320 being not contacted with the card reader. Therefore, the NAND gate 14 only determines a logic level of the first input. The output of the NAND gate 14 outputs a high level signal, such as logic 1, to the enable pin EN of the buffer 12. A first channel (e.g., electrical traces) connected between the buffer 12 and the first group of conductive pins 310, functions as an electronic path for transmitting data, and is turned on by the buffer 12. When the electronic device needs to receive first data from the memory card 10, the control chip 11 controls the memory card 10 to transmit the first data from a storage medium 16 (e.g., non-transitory storage medium) of the memory card 10 to the buffer 12 first. The buffer 12 transmits the first data to the first group of conductive pins 310 through the first channel. The first group of conductive pins 310 then transmits the first data to the electronic device. When the memory card 10 needs to receive second data from the electronic device, the second data is transmitted to the first group of conductive pins 310 from the electronic device first. The first group of conductive pins 310 transmits the second data to the buffer 12 through the first channel. The control chip 11 then controls the buffer 12 to transmit the second data to the storage medium 16 of the memory card 10.

When the memory card 10 is inserted in the card reader of the electronic device, if the card reader contacts with the second group of conductive pins 320, the second group of conductive pins 320 operate. The third pin of the second group of conductive pins 320 transmits a low level signal, such as logic 0, to an input terminal of the inverter 13. An output terminal of the inverter 13 outputs a high level signal, such as logic 1, to the second input of the NAND gate 14. The first input of the NAND gate 14 is connected to a signal of high impedance state with no logic level, due to the first group of conductive pins 310 not contacted with the card reader. Therefore, the NAND gate 14 only determines a logic level of the second input. The output of the NAND gate 14 outputs a low level signal, such as logic 0, to the enable pin EN of the buffer 12. A second channel (e.g., electrical traces) connected between the buffer 12 and the second group of conductive pins 320, functions as an electronic path for transmitting data, and is turned on by the buffer 12. When the electronic device needs to receive first data from the memory card 10, the control chip 11 controls the memory card 10 to transmit the first data from the storage medium 16 of the memory card 10 to the buffer 12 first. The buffer 12 transmits the first data to the second group of conductive pins 320 through the second channel. The second group of conductive pins 310 transmits the first data to the electronic device. When the memory card 10 needs to receive second data from the electronic device, the second data is transmitted to the second group of conductive pins 320 from the electronic device first. The second group of conductive pins 320 transmits the second data to the buffer 12 through the second channel. The control chip 11 then controls the buffer 12 to transmit the second data to the storage medium 16 of the memory card 10.

Because both of the first surface 131 and the second surface 132 of the memory card 10 have conductive pins, the memory card 10 can normally communicate with the electronic device, no matter if the conductive pins 310 of the first surface 131 or the conductive pins 320 of the second surface 132 contact with the card reader of the electronic device.

While the disclosure has been described by way of example and in terms of preferred embodiment, it is to be understood that the disclosure is not limited thereto. On the contrary, it is intended to cover various modifications and similar arrangements as would be apparent to those skilled in the art. Therefore, the range of the appended claims should be accorded the broadest interpretation so as to encompass all such modifications and similar arrangements.

What is claimed is:

1. A memory card, comprising:
   a first surface;
   a second surface opposite to the first surface;
   a first group of conductive pins set on the first surface;
   a second group of conductive pins set on the second surface;
   a buffer connected to the first group of conductive pins through a first channel and connected to the second group of conductive pins through a second channel;
   a NAND gate comprising a first input connected to a ground pin of the first group of conductive pins, a second input, and an output connected to the buffer;
   an inverter connected between a ground pin of the second group of conductive pins and the second input of the NAND gate;
   a storage medium connected to the buffer; and
   a control chip connected between the buffer and the storage medium, to control data transmission between the buffer and the storage medium;
   wherein an order of pins of the first group of conductive pins located on the first surface from left to right is same with an order of pins of the second group of conductive pins located on the second surface from left to right;
   the output of the NAND gate is connected to an enable pin of the buffer; when the enable pin of the buffer receives a high level signal outputted from the NAND gate, the first channel is turned on, and data is transmitted between the buffer and the first group of conductive pins; when the enable pin of the buffer receives a low level signal outputted from the NAND gate, the second channel is turned on, and data is transmitted between the buffer and the second group of conductive pins.

2. The memory card of claim 1, wherein a number of the first group of conductive pins is nine.

3. The memory card of claim 2, wherein the first group of conductive pins comprise a first hot plug pin.

4. The memory card of claim 3, wherein a number of the second group of conductive pins is nine.

5. The memory card of claim 4, wherein the second group of conductive pins comprise a second hot plug pin.

6. The memory card of claim 5, wherein the memory card has a ridge spire set on an end of the memory card, the first and second groups of conductive pins are set on the first and second surfaces, respectively adjacent to the ridge spire.

\* \* \* \* \*